United States Patent

Kong et al.

[11] Patent Number: 5,888,894
[45] Date of Patent: Mar. 30, 1999

[54] METHOD FOR REDUCING STRAY CONDUCTIVE MATERIAL NEAR VERTICAL SURFACES IN SEMICONDUCTOR MANUFACTURING PROCESSES

[75] Inventors: Weiran Kong, Sunnyvale; Kai-Ning Chang, San Jose, both of Calif.

[73] Assignee: Integrated Silicon Solution, Inc., Santa Clara, Calif.

[21] Appl. No.: 965,912

[22] Filed: Nov. 7, 1997

[51] Int. Cl.$^6$ .......................... H01L 21/28; H01L 21/302
[52] U.S. Cl. .......................... 438/618; 438/647; 438/648; 438/656; 438/669
[58] Field of Search .................................. 438/233, 586, 438/618, 627, 643, 647, 648, 653, 656, 657, 669, 761

[56] References Cited

U.S. PATENT DOCUMENTS

| | | | |
|---|---|---|---|
| 4,871,688 | 10/1989 | Lowrey | 438/252 |
| 5,378,648 | 1/1995 | Lin et al. | 438/719 |
| 5,472,901 | 12/1995 | Kapoor | 438/601 |
| 5,595,935 | 1/1997 | Chan et al. | 438/622 |
| 5,648,678 | 7/1997 | Begley et al. | 257/529 |
| 5,718,800 | 2/1998 | Jengling | 156/643.1 |
| 5,723,374 | 3/1998 | Huang et al. | 438/253 |
| 5,789,293 | 8/1998 | Cho et al. | 438/257 |

OTHER PUBLICATIONS

Izawa et al., "A Novel Embedded SRAM Technology with 10–$\mu m^2$ Full–CMOS Cells for 0.25–$\mu m$ Logic Devices", *IEDM Tech. Dig.*, Dec. 1994, pp. 941–943.

Minami et al., "A 6.93–$\mu m^2$ n–Gate Full CMOS SRAM Cell Technology with High–Performance 1.8–V Dual–Gate CMOS for Peripheral Circuits", *Symposium on VLSI Technology Digest of Technical Papers*, pp. 13–14 (1995).

Uehara et al., "A Novel Local Interconnect Technology (MSD) for High–Performance Logic LSIs with Embedded SRAM", *Symposium on VLSI Technology Digest of Technical Papers*, pp. 142–143 (1996).

*Primary Examiner*—T. N. Quach
*Attorney, Agent, or Firm*—Gary S. Williams; Flehr Hohbach Test Albritton & Herbert LLP

[57] ABSTRACT

A method for reducing stray conductive material near vertical surfaces in semiconductor manufacturing processes comprising the following steps. Deposit the gate oxide, polysilicon and cap oxide layers. Apply a Poly1A mask. The Poly1A mask pattern comprises the Poly1 areas that are part of the final circuit layout as well as additional Poly1 areas that are included to provide planar surfaces to prevent stringer formation. Etch the cap, polysilicon and gate oxide layers to partially form the transistor gate structures. Form oxide spacers on the sides of the transistor gate structures. Apply a source/drain mask. Deposit source/drain dopants to form diffusions. Deposit an interlayer dielectric. Mask and pattern contacts to the diffusions and the Poly1 layer. Deposit blanket TiN/Ti layer(s). Pattern the TiN/Ti layer(s) using a TiN/Ti mask and a dry anisotropic etch. Patterning the TiN/Ti layer(s) may create TiN/Ti stringers along vertical surfaces of the interconnect layer. However, by defining the Poly1A mask pattern to leave Poly1 in pre-defined potential stringer problem areas, these surfaces remain planar and thus free of stringers. Next, apply a Poly1B mask. The Poly11B mask is defined such that the final Poly1 pattern is the logical AND of the Poly1A mask pattern and the inverse of the Poly1B mask. Then etch the cap, polysilicon and gate oxide layers to complete formation of the transistor gate structures.

10 Claims, 8 Drawing Sheets

Final Poly1 pattern = Poly1A AND (NOT Poly1B)

METHOD FOR REDUCING STRAY CONDUCTIVE MATERIAL NEAR VERTICAL SURFACES IN SEMICONDUCTOR MANUFACTURING PROCESSES

The present invention relates generally to semiconductor processing, and particularly to a method of forming transistor gate structures with an overlying metal interconnect layer while preventing metal layer stringers on the sidewalls of gate structures from creating unintentional and undesirable electrical connections.

BACKGROUND OF THE INVENTION

FIG. 1 shows a simple circuit layout 100, or equivalently the mask patterns for a circuit. The circuit has four polysilicon gate MOS transistors T1, T2, T3 and T4. Although not shown in FIG. 1, the diffusion regions for transistors T1 and T3 are of a first conductivity type (e.g., N) and the diffusion regions for the other two transistors T2 and T4 are of the opposite conductivity type (P). For instance, if the substrate of the device is a P-type substrate, the right half of the circuit is located in an N-well, and the circuit shown consists of two CMOS inverters connected tail to nose (or cross connected). The mask layers shown are:

a polysilicon (Poly1) mask 102;

an interconnect metal (TiN/Ti) mask 104;

a diffusion mask 106, which actually consists of two masks, one for N-channel transistors and one for P-channel transistors, plus a well mask that is not shown in FIG. 1 at all;

a metal to diffusion contact mask 108 for defining metal layer to diffusion connections; and a metal to polysilicon contact mask 110 for defining metal layer to polysilicon connections.

For convenience, the two metal regions in the circuit are labeled as regions 112 and 114. Also, the polysilicon layer is herein called Poly1, since in many circuits a second polysilicon layer called Poly2 may also be used.

Referring to FIGS. 1, 2 and 3 method 120 illustrates a conventional semiconductor process for manufacturing the circuit. After performing the normal wafer preparation steps (including well formation and field oxide formation), the gate oxide is deposited along with the polysilicon and cap oxide (or nitride) layers that form the polysilicon gate stack (step 122). Then the Poly1 mask is applied and the cap, polysilicon and gate oxide regions are etched using conventional etching techniques to form the polysilicon transistor gate structures (step 124). Then oxide (or nitride) spacers are formed on the sides of the transistor gate structures, the source/drain regions are masked and the source/drain dopants are deposited (or implanted) to form source and drain regions (step 126). In CMOS circuits, two sets of diffusion masks and doping steps are required.

Next, an interlayer dielectric layer is deposited, and contact regions are masked and etched to form contact holes through the interlayer dielectric. These contacts are used for forming metal to diffusion and metal to polysilicon connections.

Then a metal layer such as a layer of TiN (titanium nitride) or Ti or a sandwich of the two is deposited and patterned using the metal layer mask (step 128). The particular etching method used is a potential problem that is discussed in more detail below. The metal layer etching step may create the stringers that are the subject of the present invention. Finally, the remainder of the circuit is formed using downstream processing steps which are not directly relevant to the present discussion.

Referring to FIGS. 1 and 2, the problem addressed by the present invention concerns etching the metal interconnect layer located above the polysilicon transistor gate material layers. In one embodiment, the metal interconnect layer is TiN (titanium nitride), Ti (titanium), or a sandwich of the two, and is separated from the transistor gate stack and diffusion regions by a fairly thin interlayer dielectric layer. In many semiconductor circuits the interlayer dielectric deposited after forming the transistor gate stack is thin and the partially manufactured circuit is not planarized before the metal interconnect layer is deposited and patterned.

There are generally three conventional methods of etching used to pattern the metal layer: isotropic plasma etch, anisotropic plasma etch, and wet etch. The anisotropic etch is highly directional and therefore causes less undercutting, but also tends to leave stringers along the sides of vertical surfaces, such as the sides of polysilicon gate structures. In particular, if metal stringers 118 are left along the side edges 116 of the polysilicon stack structures, those stringers may cause the two metal regions 112 and 114 to be electrically connected, causing the circuit to fail.

The isotropic plasma etch and wet etch methods leave less stringers and in fact could be used to effectively eliminate the metal stringer problem. However, the isotropic plasma etch and wet etch provide much worse control over the "critical dimensions" (CD) of the circuit being manufactured due to undercutting. Therefore, anisotropic plasma etching is highly preferred, so long as the metal stringer problem can be eliminated.

The other conventional approach to eliminating the metal stringer problem, while still using anisotropic plasma etching for metal layer patterning is to planarize the partially formed circuit after forming the polysilicon gate structure but before depositing the metal layer. However, planarizing the circuit is expensive, and causes other problems not relevant here.

It is therefore an object of the present invention to provide a semiconductor manufacturing process that eliminates the interconnect metal layer stringer problem, without requiring circuit planarization before metal layer formation, and while enabling anisotropic plasma etching to be used for metal layer patterning.

SUMMARY OF THE INVENTION

In summary, the present invention provides a method for reducing stray conductive material near vertical surfaces in semiconductor manufacturing processes. In one embodiment of the present invention after a wafer has been prepared, the method comprises the following steps. Deposit the gate oxide, polysilicon and cap oxide layers. Apply a Poly1A mask. The Poly1A mask pattern comprises the Poly1 areas that are part of the final circuit layout as well as additional Poly1 areas that are included to provide planar surfaces to prevent stringer formation. Etch the cap, polysilicon and gate oxide layers to partially form the transistor gate structures. Form oxide spacers on the sides of the transistor gate structures. Apply a source/drain mask. Deposit source/drain dopants to form diffusions. Deposit an interlayer dielectric. Mask and pattern contacts to the diffusions and the Poly1 layer. Deposit blanket TiN/Ti layer(s). Pattern the TiN/Ti layer(s) using a TiN/Ti mask and a dry anisotropic etch. Patterning the TiN/Ti layer(s) may create TiN/Ti stringers along vertical surfaces of the interconnect layer. However, by defining the Poly1A mask pattern to leave Poly1 in pre-defined potential stringer problem areas, these surfaces remain planar and thus free of stringers. Next, apply a Poly1B mask. The Poly1B mask is defined such that the final Poly1 pattern is the logical AND of the Poly1A mask pattern and the inverse of the Poly1B mask. Then etch the cap, polysilicon and gate oxide layers to complete formation of the transistor gate structures. Finally, the remainder of the circuit is formed using downstream processing steps that are not directly relevant to the present invention.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 4:
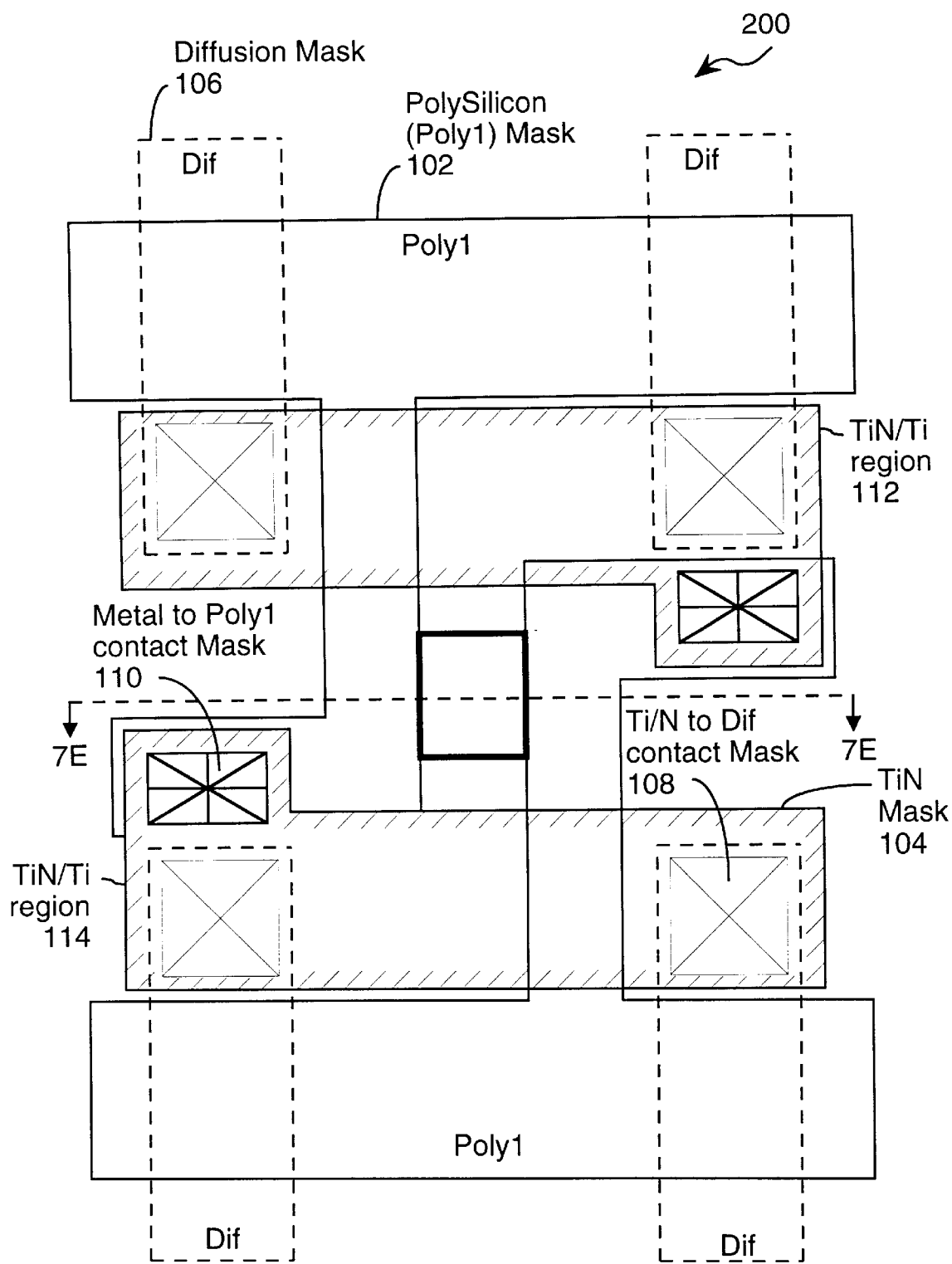
FIGS. 4, 5A and 5B illustrate a modified version of the semiconductor circuit layout of FIG. 1 in which the Poly1 mask layer is modified and divided into two mask layers such that a predefined boolean combination of the two mask layer patterns yields the original Poly1 mask layer pattern.

Referring to FIG. 4, there is shown the mask patterns that form a circuit. The circuit has four polysilicon MOS transistors T1, T2, T3 and T4. Although not shown in FIG. 4, the diffusion regions for transistors T1 and T3 are of a first conductivity type (e.g., N) and the diffusion regions of the other two transistors T2 and T4 are of the opposite conductivity type (P). For instance, if the substrate of the device is a P-type substrate, the right half of the circuit is located in an N-well, and the circuit shown consists of two CMOS inverters connected tail to nose (or cross connected). The circuit may, for example, be used as part of a 0.25 $\mu$m six transistor Static Random Access Memory (SRAM) cell. The mask layers shown are:

a polysilicon (Poly1A) mask 402;

an interconnect metal (TiN/Ti) mask 404;

a diffusion mask 406, which actually consists of two masks, one for N-channel transistors and one for P-channel transistors, plus a well mask that is not shown in FIG. 4 at all;

a metal to diffusion contact mask 408 for defining metal layer to diffusion connections;

a metal to polysilicon contact mask 410 for defining metal layer to polysilicon connections; and a polysilicon (Poly1B) mask 420.

The two metal regions in the circuit are labeled as regions 412 and 414.

Figure 5A:
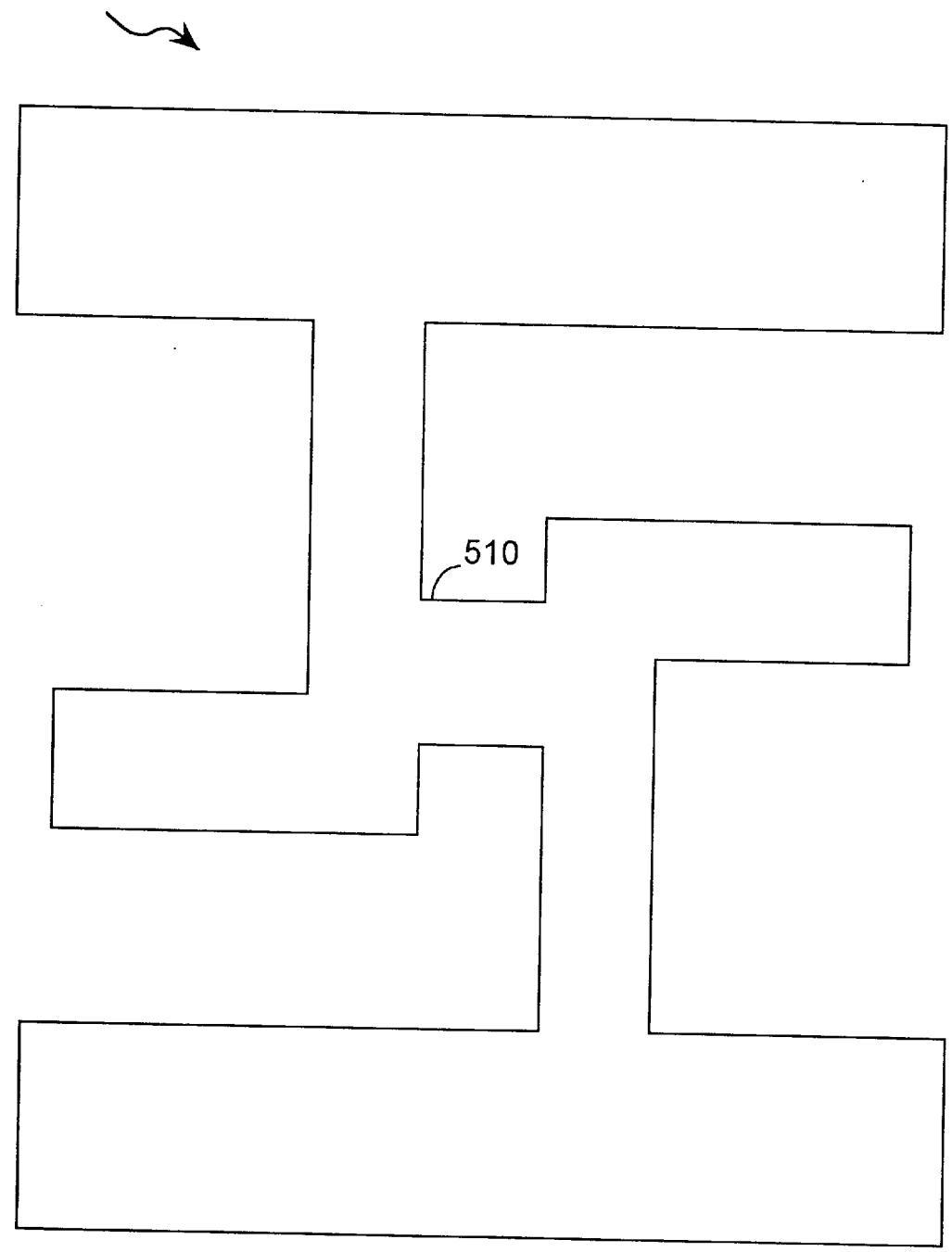
Figure 5B:
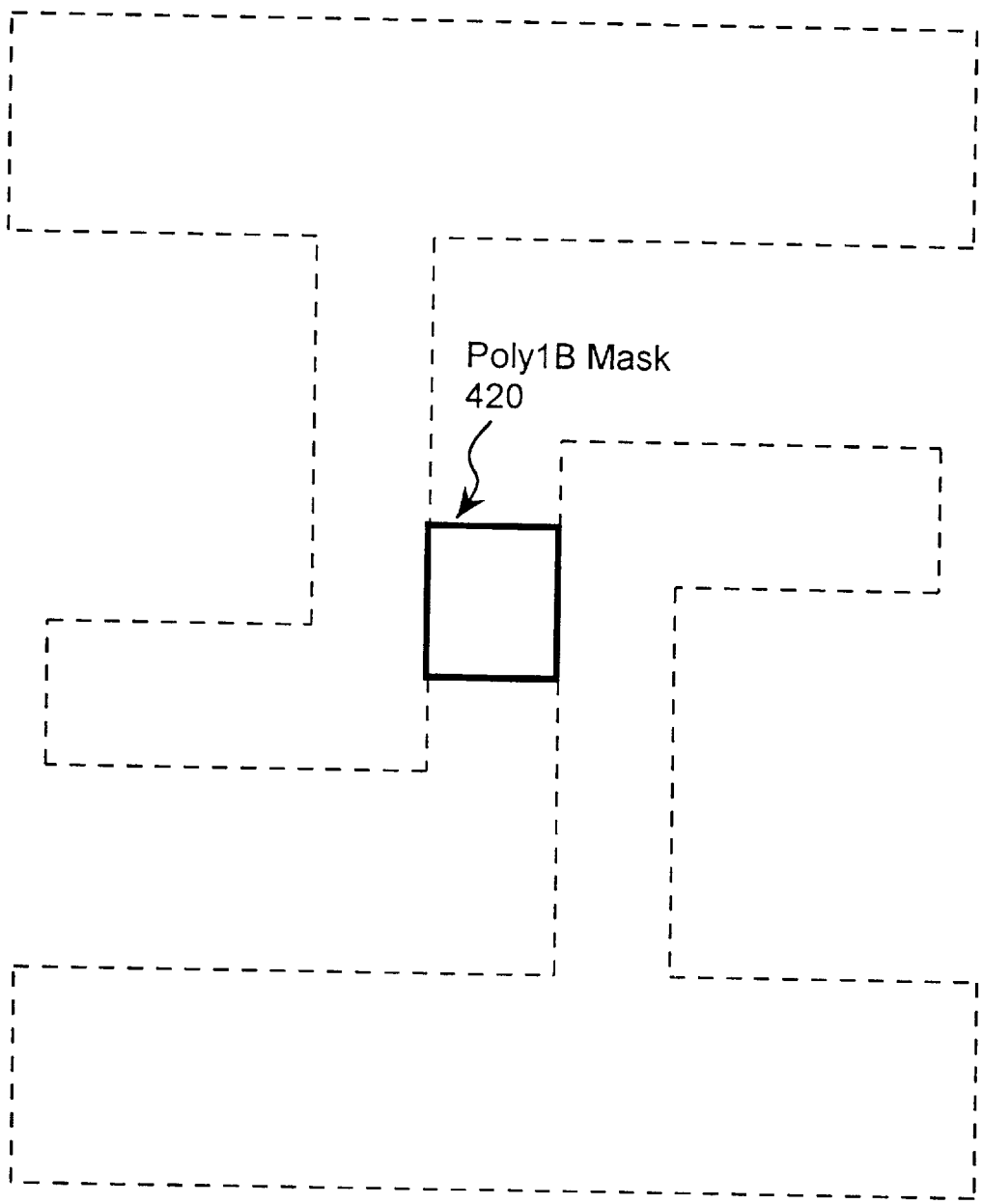
Figure 6:
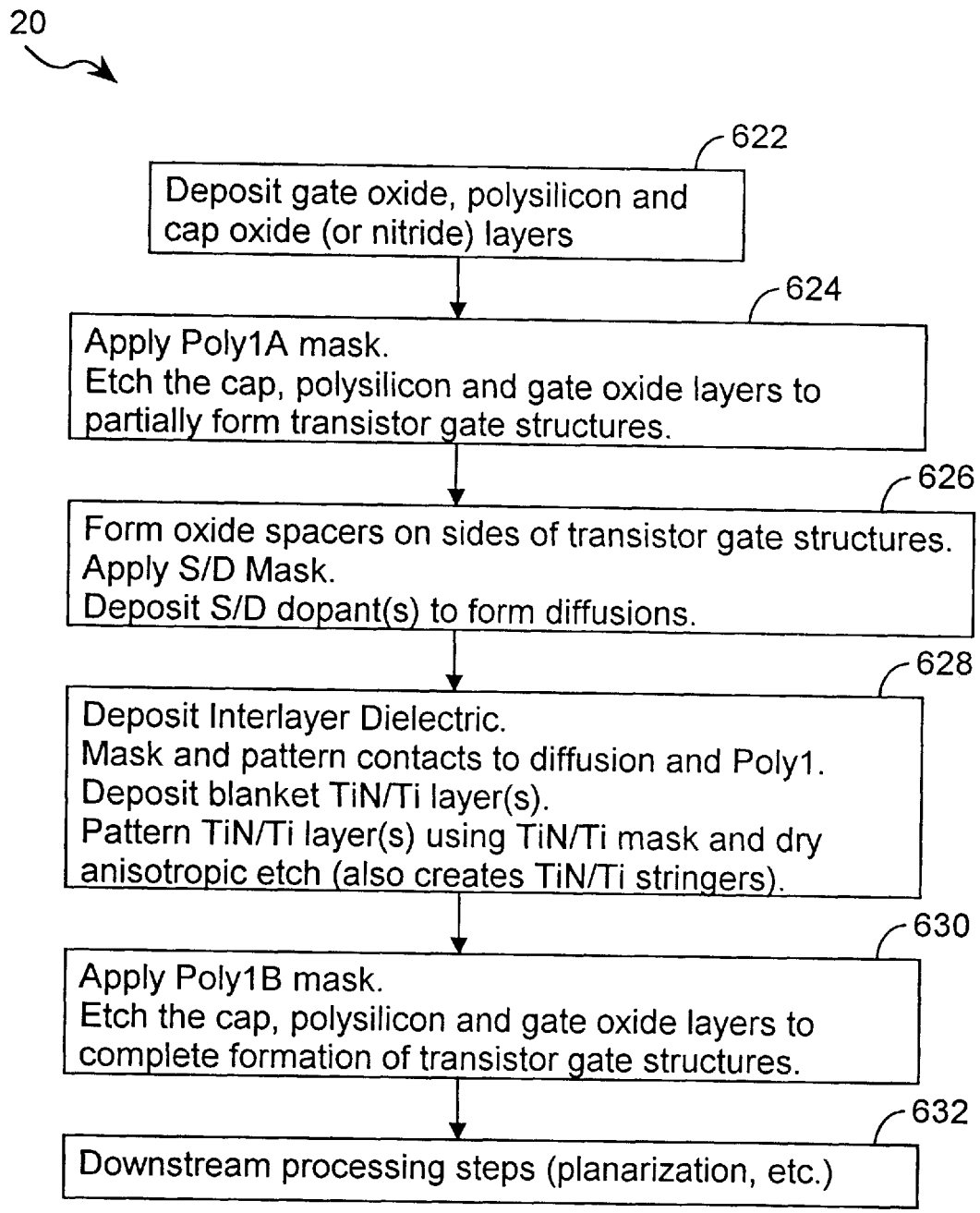
FIG. 6 is a flow chart of a modified semiconductor manufacturing process that, in conjunction with the modified Poly1 mask, can be used to eliminate the metal layer stringer problem.
Figure 7A:
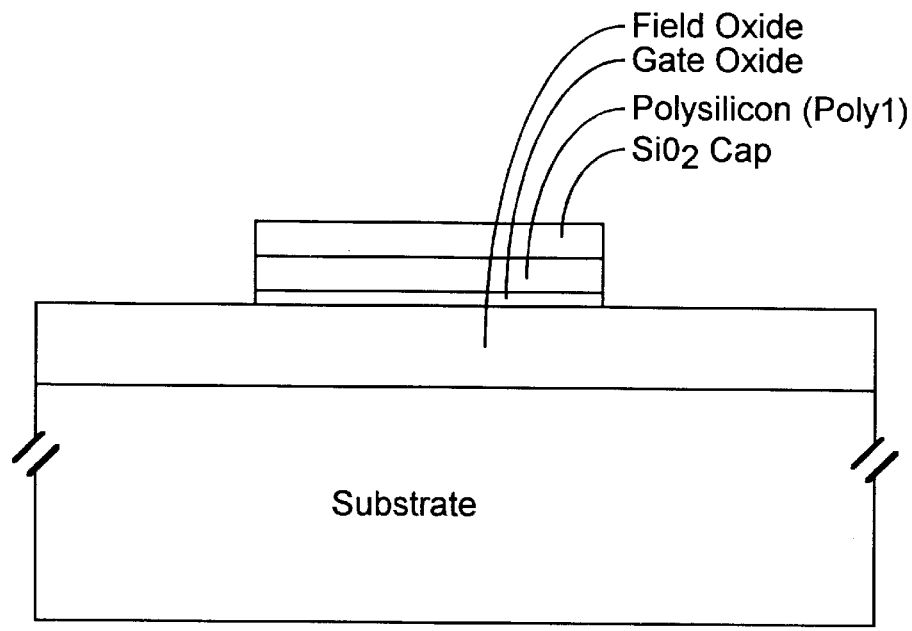
FIGS. 7A through 7E are a sequence of cross sections of the semiconductor circuit, whose layout is shown in FIG. 5, during manufacturing of that circuit.
Figure 7B:
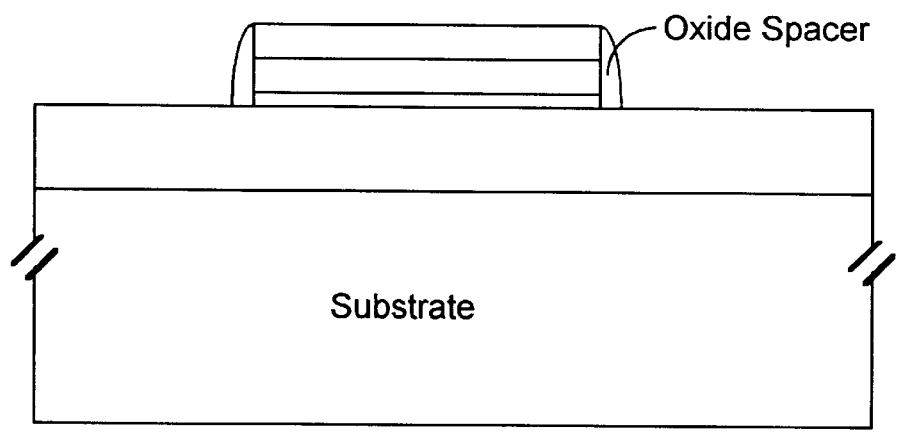

Referring to FIG. 6 there is shown a semiconductor process 620 according to one embodiment of the present invention. After performing the normal wafer preparation steps (including well formation and field oxide formation), the gate oxide is deposited along with the polysilicon and cap oxide (or nitride) layers that form the polysilicon gate stack (step 622). Next, a Poly1A mask is applied. An example of a Poly1A mask is illustrated in FIG. 5A. The Poly1A mask defines two cross coupled gate regions, and a region 510 connecting the two cross coupled gate regions. Coupling region 510 coincides with the pattern defined by the Poly1B mask illustrated in FIG. 5B. The cap, polysilicon and gate oxide layers are then etched to partially form transistor gate structures (step 624). FIG. 7A illustrates a cross section of the circuit layout taken at line 7E illustrated in FIG. 4 after step 624 is completed. As shown in FIG. 7A leaving the 510 region of the Poly1 layer in step 624 maintains a planar surface between the two cross coupled gate Poly1 areas in the 510 region. Then oxide (or nitride) spacers are formed on the sides of the transistor gate structures, the source/drain regions are masked and the source/drain dopants are deposited (or implanted) to form source and drain regions (step 626). FIG. 7B illustrates a cross section of the circuit layout after step 626 is completed. In CMOS circuits, two sets of diffusion masks and doping sets are used.

Figure 1:
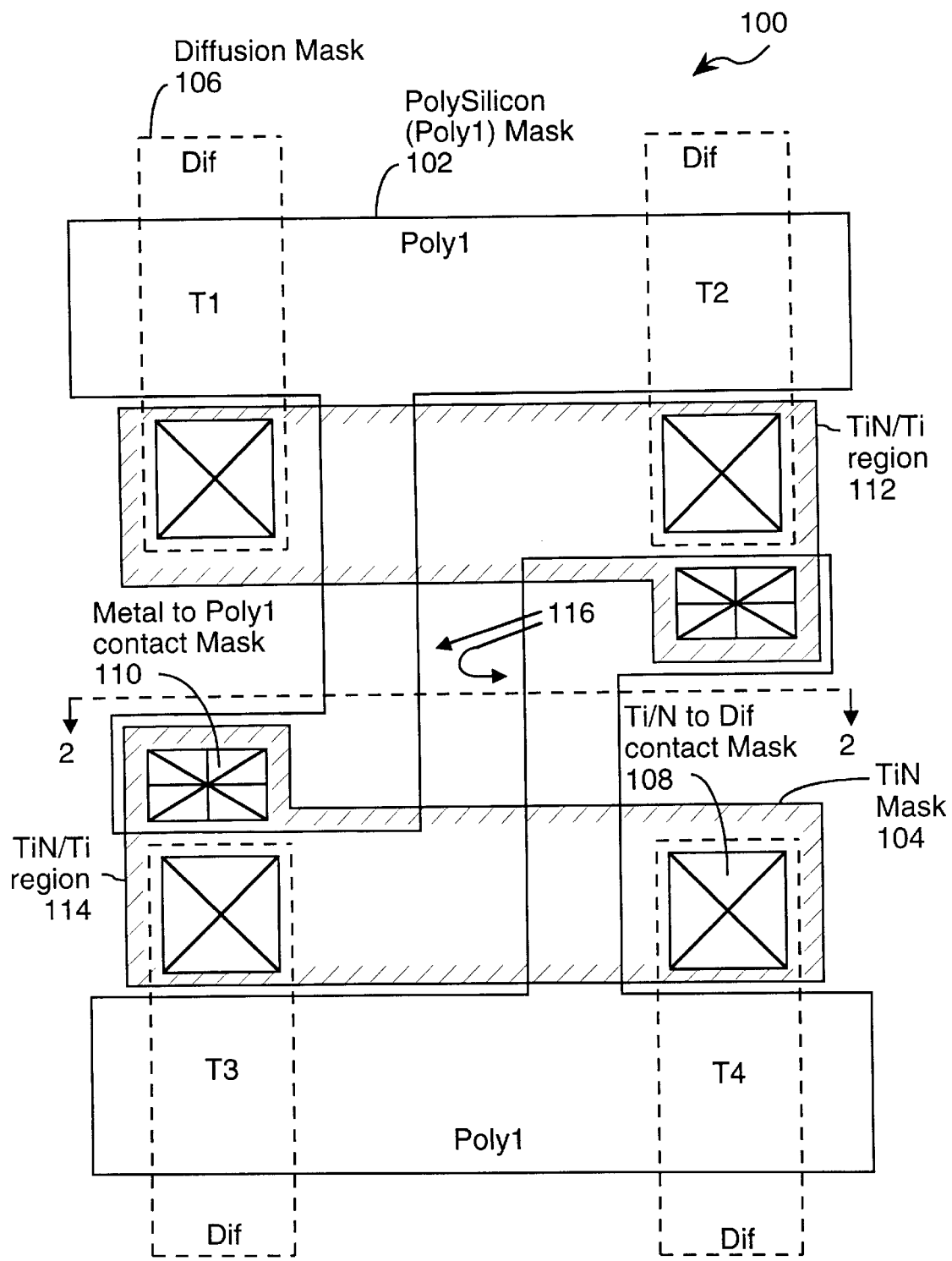
FIG. 1 illustrates a semiconductor circuit layout.
Figure 2:
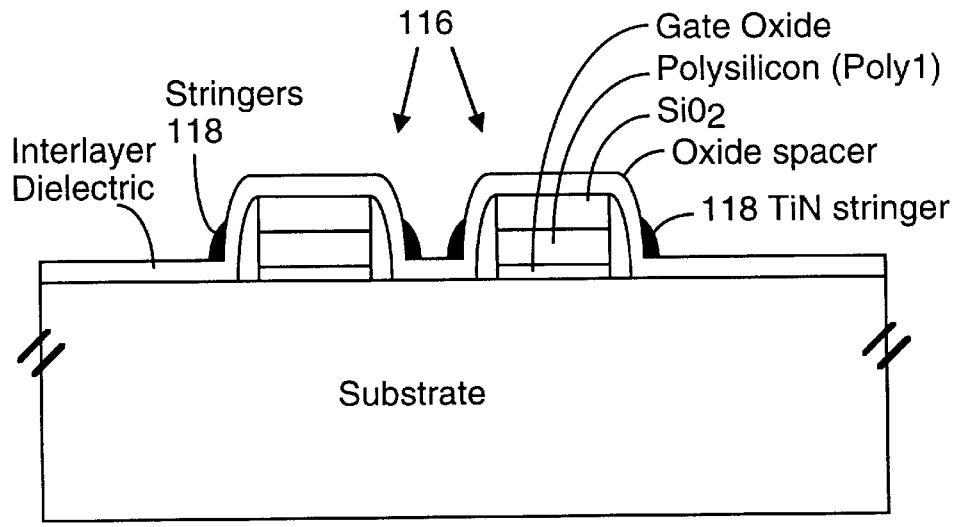
FIG. 2 illustrates a cross section of the semiconductor circuit whose layout is shown in FIG. 1.
Figure 3:
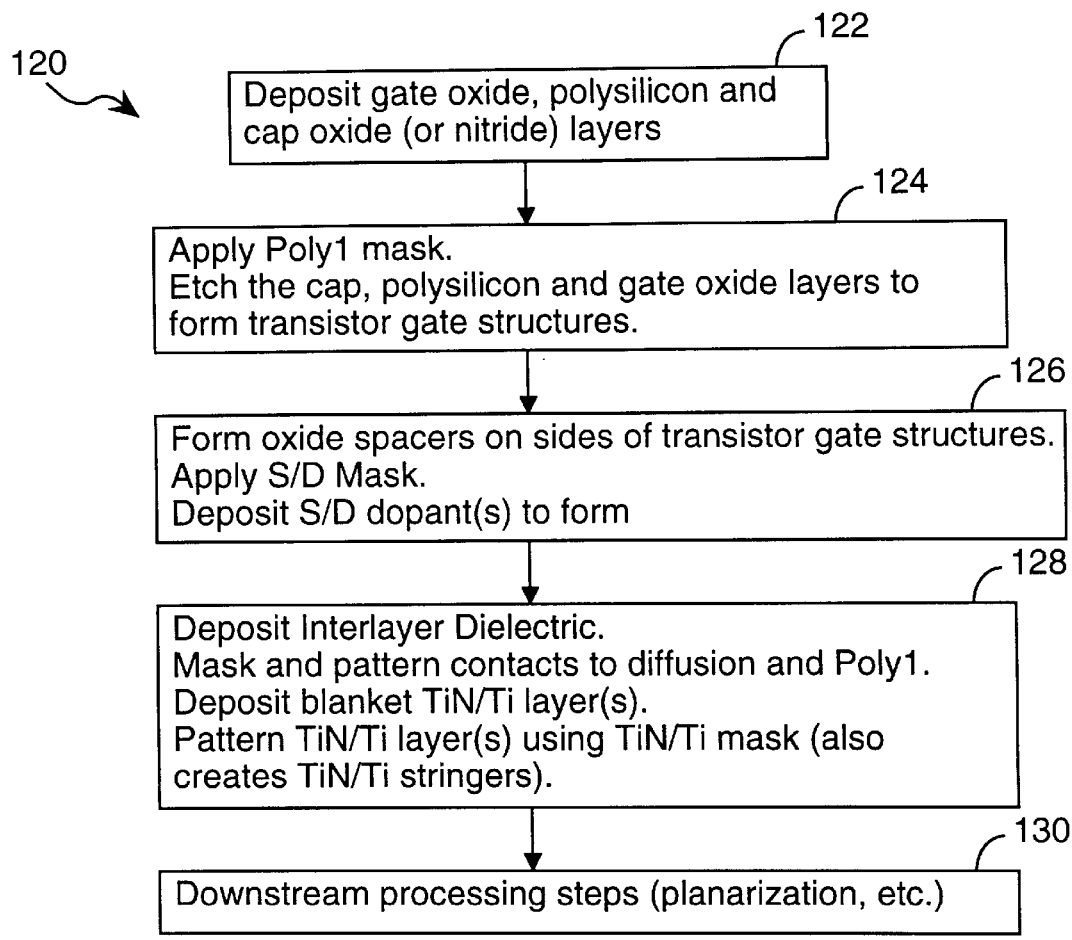
FIG. 3 is a flow chart of a conventional semiconductor manufacturing process.
Figure 7C:
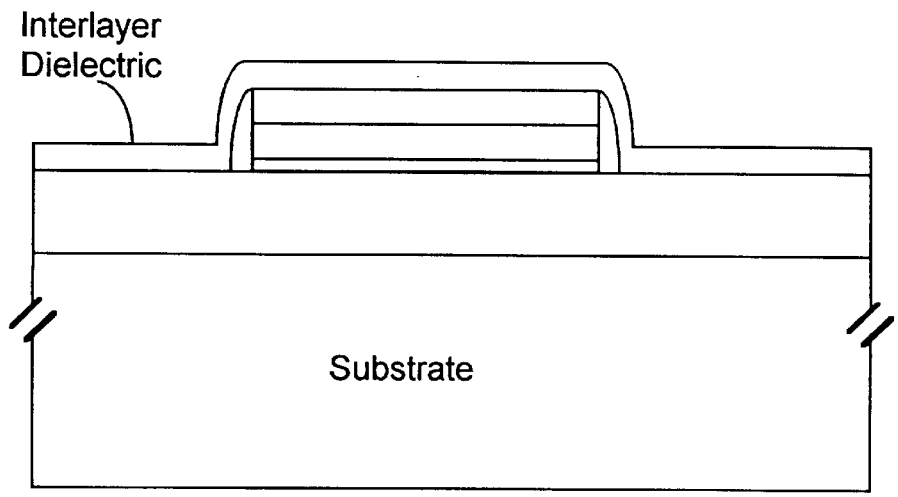
Figure 7D:
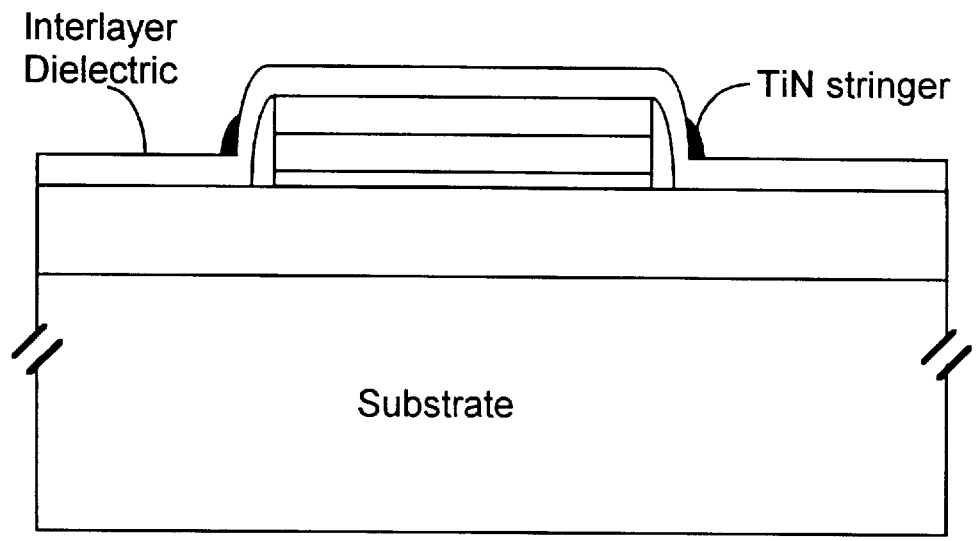

Next, an interlayer dielectric layer is deposited, and contact regions are masked and etched to form contact holes through the interlayer dielectric. These contacts are used for forming metal to diffusion and metal to polysilicon connections. FIG. 7C illustrates a cross section of the circuit layout after the interlayer dielectric is deposited. Then a metal layer such as a layer of TiN (titanium nitride) or Ti or a sandwich of the two is deposited and patterned using the metal layer mask. In this process the TiN/Ti layer is deposited to form local interconnections prior to the planarization layer. The TiN/Ti layer(s) is then masked and etched using a dry anisotropic etch (step 628). FIG. 7D illustrates a cross section of the circuit layout after step 628 is completed. FIG. 7D also illustrates the formation of TiN stringers along the sides of the Poly1 local interconnect which are formed as a result of the difficulties of etching a metal layer along vertical surfaces using a dry anisotropic etch. In contrast to FIG. 2, there are no stringers formed on surface 740 because the surface is planar. The surface 740 is planar because the Poly1 in region 510, illustrated in FIG. 5A, is not removed in step 624.

Figure 7E:
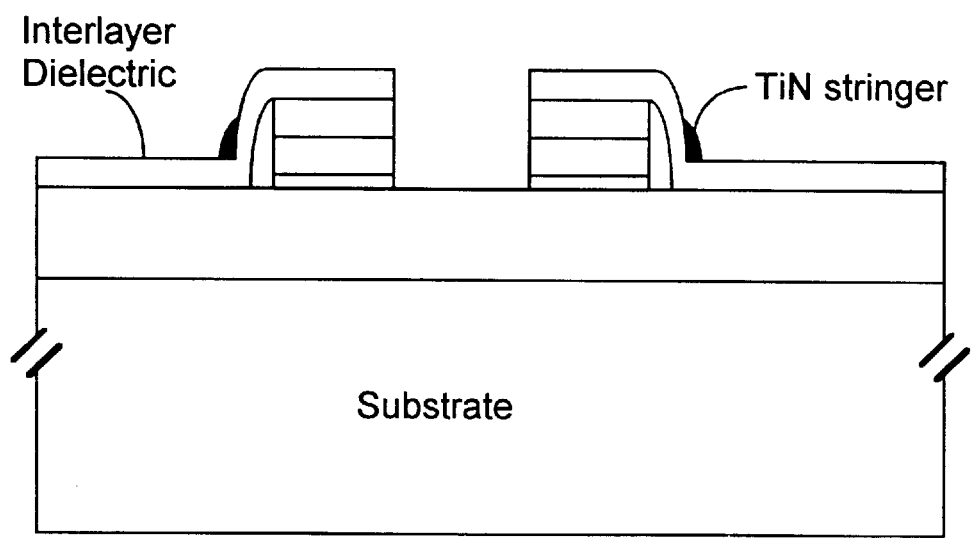

A Poly1B mask is then applied. The Poly1B mask for the circuit of FIG. 4 is illustrated in FIG. 5B. The cap, polysilicon and gate oxide layers are then etched to complete the formation of the transistor gate structures (step 630). The Poly1B mask corresponds to the Poly1 region 510. More generally, the Poly1B mask is defined such that the final Poly1 pattern is a logical AND function of the Poly1A pattern and the inverse of the Poly1B pattern. As is known by those of ordinary skill in the art, positive and negative masks/photoresists may be used to form the patterns. By defining the Poly1A and Poly1B patterns according to this relationship, those additional Poly1 regions that are left on the wafer after the Poly1A mask etch step only for the purpose of preventing stringers, are removed in the Poly1B mask etch step. FIG. 7E illustrates a cross section of the circuit layout after step 630 is completed. As illustrated in FIG. 7E, the present invention avoids the formation of stringers along the Poly1 walls in area 750 which comprises the trench between the two adjacent polysilicon local interconnects. Etching area 750 after the TiN/Ti interconnect layer has been etched prevents the formation of interconnect stringers in area 750. The localized planarization technique of the present invention is generally applicable any where stringers are formed due to non-planar surfaces. Finally, the remainder of the circuit is formed using downstream processing steps which are not directly relevant to the present invention.

The present invention thereby uses an anisotropic dry etch method to maximize control over critical dimensions by avoiding the undercutting problems of wet etch steps, and avoids the stringer interconnect problems in predefined potential problem areas.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of forming local interconnects that reduces stringer formation, the steps of the method comprising:
   (a) forming a first material layer on a semiconductor substrate;
   (b) patterning said first material layer using a first pattern;
   (c) forming a second material layer on said first material layer;
   (d) patterning said second material layer;
   (e) patterning said first material layer using a second pattern, wherein said second pattern is defined so as to remove areas of said first material layer left on said substrate in step (b) to prevent formation of second material layer stringers.

2. The method of claim 1 wherein said step (b) and said step (e) use an anisotropic etch.

3. The method of claim 2 wherein said first pattern is formed by logically combining said second pattern with a third pattern, wherein said third pattern corresponds to the patterned first material layer after step (e).

4. The method of claim 3 wherein said second material layer is comprised of a plurality of component layers, wherein one of said component layers is TiN.

5. The method of claim 3 wherein said second material layer is comprised of a plurality of component layers, wherein one of said component layers is Ti.

6. A method of forming local interconnects that reduces stringer formation, the steps of the method comprising:
   (a) forming a poly layer on a semiconductor substrate;
   (b) patterning said poly layer using a first pattern;
   (c) forming an interlayer dielectric on said poly layer;
   (d) patterning said interlayer dielectric;
   (e) forming an interconnect layer on said interlayer dielectric;
   (f) patterning said interconnect layer;
   (g) patterning said poly layer using a second pattern, wherein said second pattern is defined so as to remove areas of said poly layer left on said substrate in step (b) to prevent formation of interconnect layer stringers.

7. The method of claim 6 wherein said step (b) and said step (g) use an anisotropic etch.

8. The method of claim 7 wherein said first pattern is formed by logically combining said second pattern with a third pattern, wherein said third pattern corresponds to the patterned poly layer after step (g).

9. The method of claim 8 wherein said interconnect layer is comprised of a plurality of component layers, wherein one of said component layers is TiN.

10. The method of claim 8 wherein said interconnect layer is comprised of a plurality of component layers, wherein one of said component layers is Ti.

* * * * *